US007692476B2

(12) United States Patent
Anzai

(10) Patent No.: US 7,692,476 B2
(45) Date of Patent: Apr. 6, 2010

(54) TEMPERATURE COMPENSATING CIRCUIT

(75) Inventor: Ryoichi Anzai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 325 days.

(21) Appl. No.: 11/846,417

(22) Filed: Aug. 28, 2007

(65) Prior Publication Data

US 2008/0054871 A1 Mar. 6, 2008

(30) Foreign Application Priority Data

Aug. 29, 2006 (JP) ............................ 2006-232194

(51) Int. Cl.
*H03K 3/42* (2006.01)

(52) U.S. Cl. ........................ 327/513; 327/539; 323/907

(58) Field of Classification Search ................. 327/322, 327/361, 355, 512, 513, 541, 539, 543; 323/312-316, 323/901, 907
See application file for complete search history.

(56) References Cited

FOREIGN PATENT DOCUMENTS

JP 6-174489 A 6/1994

*Primary Examiner*—Rajnikant B Patel
(74) *Attorney, Agent, or Firm*—Brinks Hofer Gilson & Lione

(57) ABSTRACT

Provided is a temperature compensating circuit, which conducts a temperature correction having a continuous characteristic, and is small in the circuit scale. An output voltage VOUT at a connection point 14 is determined on the basis of a current Ia2, a current Ib2, and a current Ic2, and an output voltage of a temperature sensor circuit is corrected by the output voltage VOUT with a temperature. As a result, the temperature correction having the continuous characteristic is conducted on the basis of a current change of the current Ia2, the current Ib2, and the current Ic2. Because the plural temperature compensating circuits are not provided, and only one temperature compensating circuit is provided, the circuit scale becomes smaller.

2 Claims, 8 Drawing Sheets

TEMPERATURE COMPENSATING CIRCUIT

This application claims priority under 35 U.S.C. §119 to Japanese Patent Application No. JP2006-232194 filed Aug. 29, 2006, the entire content of which is hereby incorporated by reference.

BACKGROUND OF THE INVENTION

1. Field of the Invention

The present invention relates to a temperature compensating circuit for correcting an output voltage of a temperature sensor circuit with a temperature.

2. Description of the Related Art

In general, an output of a sensor fluctuates due to a temperature. For example, in a pressure sensor, a zero-point offset voltage of the sensor output signal nonlinearly changes with respect to the temperature. This phenomenon will be described with reference to FIG. 9. In the sensor output, the zero-point offset voltage should be held constant regardless of a temperature Ta, as indicated by a curve 61. However, in fact, the zero-point offset voltage varies to a positive or negative side without regularity as indicated by curves 62 to 64. For those sensors, it is necessary that the individual sensors are subjected to different temperature corrections, respectively, and to achieve this, there is required a circuit capable of freely changing a positive correction, a negative correction, and their correction quantity. In order to solve the above problem, for example, a method disclosed in JP 06-174489 A has been proposed. That is, in a circuit diagram of FIG. 5, reference numeral 1 denotes a temperature compensating circuit. A power supply Vcc and an adjusted voltage Vi that is divided by resistors R5 and R6 are supplied to terminals 11 and 12 of the temperature compensating circuit 1. The adjusted voltage Vi is supplied to positive terminals of two operational amplifiers OP1 and OP2. The respective operational amplifiers OP1 and OP2 constitute a V/I converter (voltage/current converter) together with transistors Tr1 and Tr2. Currents Ia and Ib that are in proportion to the adjusted voltage Vi are supplied to temperature compensation resistors R1 and R2 which are different in temperature coefficients TC1 and TC2, respectively, by means of the V/I converter. Those currents Ia and Ib flow in transistors Tr3 and Tr4. The transistors Tr3 and Tr5, Tr4 and Tr6, and Tr7 and Tr8 constitute current mirror circuits, respectively. A current that is equal to a current that flows in the temperature compensation resistors R1 and R2 is allowed to flow in the transistors Tr5 and Tr6 as well as Tr7 and Tr8. Voltage divider resistors R3 and R4 are connected between the power supply Vcc and the ground G. The transistor Tr5 is connected in parallel to the resistor R3 that is connected at the power supply Vcc side, and the transistor Tr7 is connected in parallel to the resistor R4 that is connected at the ground G side. The current Ia of the transistor Tr5 flows into a connection point 14 between the voltage divider resistors R3 and R4, and the current Ib of the transistor Tr7 flows out of the connection point 14. The voltage at the connection point 14 is derived from a terminal 13 as an output Vo of the temperature compensating circuit 1. The output Vo of the temperature compensating circuit 1 is connected to a negative input terminal of the operational amplifier OP3 which is connected with the sensor output, and the sensor output that varies due to the temperature is subjected to temperature compensation. The provision of plural temperature compensating circuits enables the sensor output voltage that nonlinearly changes with respect to the temperature to be corrected. This structure will be described with reference to FIG. 7. Four temperature compensating circuits 1 to 4 are prepared. The respective temperature compensating circuits 1 to 4 set the resistances of the internal temperature compensation resistors R1 and R2, individually. The first temperature compensating circuit 1 satisfies TC1>TC2 so as to conduct a negative temperature correction when the temperature is lower than a set temperature Ta=25° C., the second temperature compensating circuit 2 satisfies TC1<TC2 so as to conduct a positive temperature correction when the temperature is lower than the set temperature. The third temperature compensating circuit 3 satisfies TC1>TC2 so as to conduct a negative temperature correction when the temperature is equal to or higher than the set temperature, and the fourth temperature compensating circuit 4 satisfies TC1<TC2 so as to conduct a positive temperature correction when the temperature is equal to or higher than the set temperature. Also, the respective temperature compensating circuits 1 to 4 are supplied with adjusted voltages, and can freely set the correction quantities, individually. Then, in the respective temperature compensating circuits 1 to 4, the voltage divider resistors R3 and R4 in FIG. 5 are omitted, and shared voltage divider resistors Ra and Rb are disposed instead of the voltage divider resistors R3 and R4. Accordingly, the connection point between the transistor Tr5 and the transistor Tr7 is derived from the terminal 13, and is connected to the shared voltage divider resistors Ra and Rb through contact points 6 and 7 which will be described later.

A temperature detecting circuit 5 is disposed in addition to the respective temperature compensating circuits 1 to 4, and the temperature detecting circuit 5 turns on/off the respective contact points 6 and 7 based on the detected temperature. When the temperature Ta is equal or higher than the set temperature 25° C., the temperature detecting circuit 5 turns off the contact point 6, and turns on the contact point 7. When the temperature Ta is lower than the set temperature, the temperature detecting circuit 5 turns on the contact point 6, and turns off the contact point 7. Then, the outputs of the temperature compensating circuits 1 and 2 which are used when the temperature Ta is lower than the set temperature are connected to the connection point 15 of the voltage divider resistors Ra and Rb through the contact point 6. The outputs of the temperature compensating circuits 3 and 4 which are used when the temperature Ta is equal to or higher than the set temperature are connected to the connection point 15 through the contact point 7. Then, the output Vo of the connection point 15 of the voltage divider resistors Ra and Rb is input to a negative terminal of the operational amplifier OP3 which is connected with the sensor output, to compensate the sensor output that fluctuates due to the temperature with a temperature. For example, when it is assumed that the sensor output characteristic that corrects the temperature is indicated by a curve 62 of FIG. 9, it is necessary to conduct the negative temperature correction when the temperature Ta is equal to or higher than the set temperature 25° C., and to conduct the positive temperature correction when the temperature Ta is lower than the set temperature 25° C. Also, it is necessary to set the correction quantity to be relatively larger when the temperature Ta is equal to or higher than the set temperature, and to set the correction quantity to be relatively smaller when the temperature Ta is lower than the set temperature. For that reason, the temperature compensating circuits 1 and 4 are selected. The remaining temperature compensating circuits 2 and 3 are prevented from outputting by cutting off a line that inputs the adjusted voltage Vi to the terminal 12. Also, the voltage divider resistors R5*d* and R6*d* are adjusted so that a large adjusted voltage Vi is input to the temperature compensating circuit 4 which conducts a large negative temperature correction. The voltage divider resistors R5*a* and R6*a* are adjusted so that a small adjusted voltage Vi is input to the temperature compensating circuit 1 which conducts a small positive temperature correction. With the above structure, the curves 52 and 54 in FIG. 8 are selected with the adjusted correction quantities. Then, the outputs of the respective temperature compensating circuits 1 and 4 are selected by the temperature detecting circuit 5 based on the temperature, and then input to the voltage divider resistors Ra and Rb. The correction quantity corresponding to the temperature is generated at the connection point 15 of the voltage divider resistors Ra and Rb through the principle described in a first embodiment of JP 06-174489 A. The output Vo of the temperature compensating circuit is input to the operational amplifier OP3 to conduct the temperature correction of the sensor output.

However, in the conventional method, there is a possibility that the temperature correction having a discontinuous characteristic is conducted before and after one temperature compensating circuit is changed over to another temperature compensating circuit. For example, as shown in FIG. 8, when the temperature compensating circuit changes over to another temperature compensating circuit at the set temperature 25° C., there is the continuity of the correction quantity of the temperature correction. However, when the temperature compensating circuit changes over to another temperature compensating circuit at another temperature, the continuity is lost.

Also, because four temperature compensating circuits are provided, the circuit scale becomes larger.

SUMMARY OF THE INVENTION

The present invention has been made in view of the above problems, and therefore an object of the present invention is to provide a temperature compensating circuit for conducting the temperature correction having a continuous characteristic and is small in the circuit scale.

According to the present invention, there is provided a temperature compensating circuit for correcting an output voltage of a temperature sensor circuit with a temperature, the temperature sensor circuit including: a first current output means for outputting a first current based on a supply voltage and a first resistor having a first temperature characteristic; a second current output means for outputting a second current based on the supply voltage and a second resistor having a second temperature characteristic; a connection point that is supplied with a current based on the first current and a current based on the second current which are different in polarity from each other; and a current mirror circuit for supplying a current, based on a difference between the current based on the first current and the current based on the second current, to the connection point.

With the above structure, the first current based on the first temperature characteristic and the second current based on the second temperature characteristic are supplied to the connection point. Further, the current based on the difference between the current based on the first current and the current based on the second current are supplied to the connection point. Accordingly, the voltage at the connection point is determined based on the currents.

According to the present invention, the voltage at the connection point is determined based on the first current, the second current, and the difference between the current based on the first current and the current based on the second current. Also, the output voltage of the temperature sensor circuit is corrected by the voltage at the connection point with a temperature. As a result, the temperature correction having the continuous characteristic is conducted on the basis of a current change of the first current, the second current, and the difference between the current based on the first current and the current based on the second current.

Further, in the present invention, since plural temperature compensating circuits are not provided, and only one temperature compensating circuit is provided, the circuit scale becomes smaller.

DETAILED DESCRIPTION OF THE PREFERRED EMBODIMENTS

First Embodiment

Figure 1:
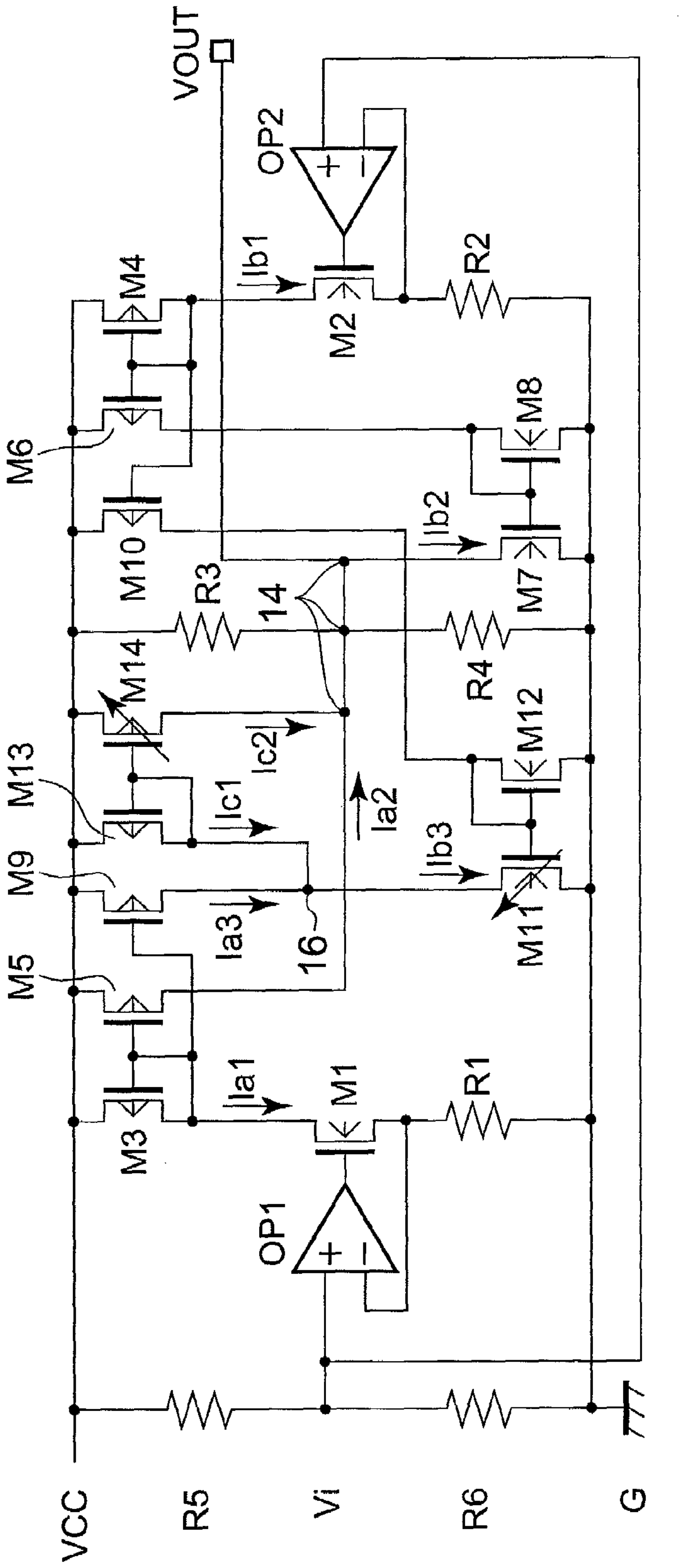
FIG. 1 is a diagram showing an outline of a temperature compensating circuit according to a first embodiment of the present invention.

First, a description will be given of a temperature compensating circuit according to a first embodiment of the present invention. FIG. 1 is a diagram showing the outline of a temperature compensating circuit according to the first embodiment of the present invention.

The temperature compensating circuit includes transistors M1 to M14, resistors R1 to R6, a connection point 14, a connection point 16, and operational amplifiers OP1 and OP2.

The resistors R5 and R6 are disposed between a supply voltage VCC and a ground G, and the supply voltage VCC are divided by those resistors R5 and R6 into an adjusted voltage Vi, and input to noninverting input terminals of the operational amplifiers OP1 and OP2, respectively. The operational amplifier OP1 and the transistor M1 constitute a voltage/current converter, and the converter allows a current Ia1 based on the adjusted voltage Vi to flow in the resistor R1 having a temperature coefficient TC1. The current Ia1 also flows in the transistor M3. Likewise, the operational amplifier OP2 and the transistor M2 also allow a current Ib1 based on the adjusted voltage Vi to flow in the resistor R2 having the temperature coefficient TC2, and the current Ib1 also flows in the transistor M4.

In this example, the transistor M3, the transistor M5, and the transistor M9 constitute a current mirror circuit, and a current Ia2 based on the current Ia1 flows into the connection point 14. Also, the transistor M4, the transistor M6, and the transistor M10 constitute a current mirror circuit, and the transistors M7 and M8 also constitute a current mirror circuit. The current Ib2 based on the current Ib1 is extracted from the connection point 14.

Also, the current mirror circuit allows a current Ia3 based on the current Ia1 to flow into the connection point 16. Also, the transistors M11 and M12 constitute a current mirror circuit, and a current Ib3 based on the current Ib1 is extracted from the connection point 16.

In this case, the transistors M13 and M14 constitute a current mirror circuit, the drain of the transistor M13 is connected to the connection point 16, and the drain of the transistor M14 is connected to the connection point 14. With the above structure, a current Ic1 into which the current Ia3 is subtracted from the current Ib3 flows into the transistor M13. Also, a current Ic2 based on the current Ic1 flows in the transistor M14, and the current Ic2 flows into the connection point 14.

A resistor R3 is disposed at a supply voltage VCC side of the connection point 14, and a resistor R4 is disposed at the ground G side of the connection point 14. The output voltage VOUT of the connection point 14 corrects the output voltage of a temperature sensor circuit not shown with a temperature.

The mirror ratio of the transistors M11 and M12 and the mirror ratio of the transistors M13 and M14 can be changed by a circuit modification due to a trimming or a signal from the external.

Figure 2:
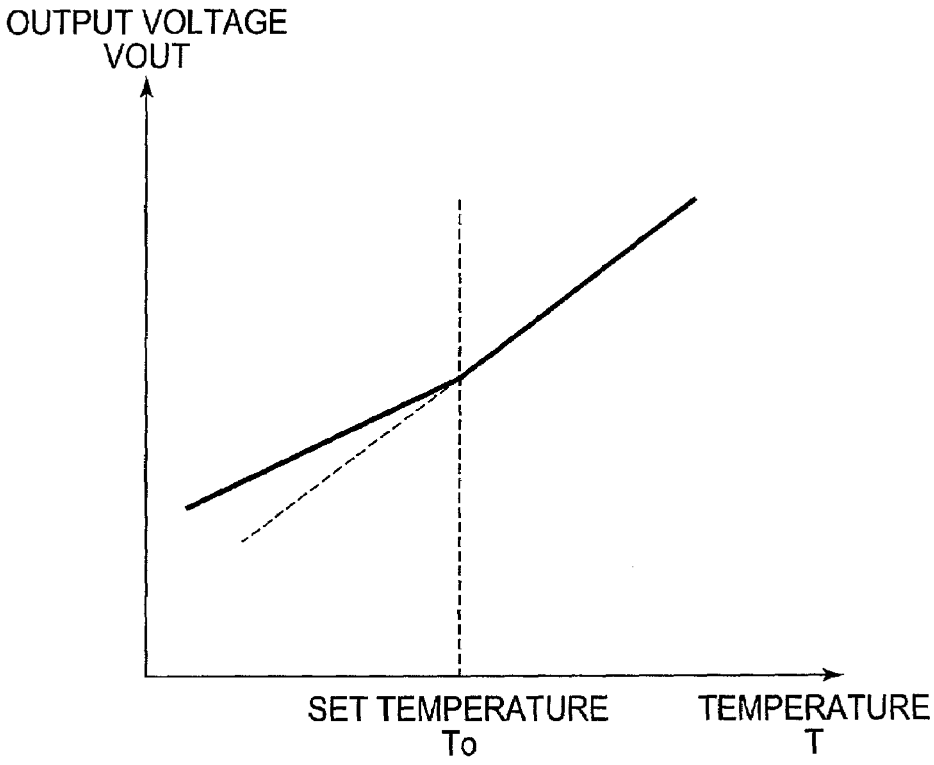
FIG. 2 is a diagram showing a temperature characteristic of an output voltage according to the first embodiment of the present invention.

Subsequently, the output voltage VOUT will be described. FIG. 2 is a diagram showing a temperature characteristic of an output voltage according to the first embodiment of the present invention.

In this example, it is assumed that when the temperature coefficient TC2 of the resistor R2 is larger than the temperature coefficient TC1 of the resistor R1, and the temperature T is 25° C., the resistances of the resistors R1 and R2 are equal to each other. When it is assumed that both of the resistances of the resistors R1 and R2 are Ro when the temperature T is 25° C., the temperature T is T, the resistance of the resistor R1 is R1, and the resistance of the resistor R2 is R2, the resistance R1 is calculated by the following expression.

$$R1=Ro*\{1+TC1*(T-25)\} \quad (1)$$

The resistance R2 is calculated by the following expression.

$$R2=Ro*\{1+TC2*(T-25)\} \quad (2)$$

Also, when the voltage value of the adjusted voltage Vi is Vi, the current value Ia1 of the current Ia1 that flows in the transistor M3 is calculated by the following expression.

$$Ia1=Vi/R1 \quad (3)$$

The current value Ib1 of the current Ib1 that flows in the transistor M4 is calculated by the following expression.

$$Ib1=Vi/R2 \quad (4)$$

Also, when it is assumed that the mirror ratio of the transistor M11 and the transistor M12 is 1:K1, the current value Ib3 of the current Ib3 is calculated by the following expression.

$$Ib3=K1*Ib1 \quad (5)$$

Through the above expressions (1) to (5), the temperature T when Ia3=Ib3 is set to the set temperature To, and the set temperature To is calculated by the following expression.

$$To=25+(1-K1)/(K1*TC1-TC2) \quad (6)$$

When the temperature T is equal to or higher than the set temperature To, the temperature coefficient TC2 of the resistor R2>the temperature coefficient TC1 of the resistor R1, and the resistance R2≧the resistance R1 are established. As a result, the current value Ib3≦the current value Ia3 is established. In this case, the voltage of the connection point 16 is substantially equal to the supply voltage VCC, and the transistors M13 and M14 do not allow the current to flow. In this case, the voltage value VOUT of the output voltage VOUT is calculated by the following expression.

$$VOUT=R3*R4/(R3+R4)[VCC/R3+(1/R1-1/R2)*Vi] \quad (7)$$

When the temperature T is lower than the set temperature To, the current value Ib3>the current value Ia3 is established. In this case, the current value Ic1 of the current Ic1 in the transistor M13 is calculated by the following expression.

$$Ic1=Ib3-Ia3=K1*Ib1-Ia3 \quad (8)$$

Also, when it is assumed that the mirror ratio of the transistor M13 and the transistor M14 is 1:K2, the current value Ic2 of the current Ic2 in the transistor M14 is calculated by the following expression.

$$Ic2=K2*Ic1 \quad (9)$$

The current Ic2 flows into the connection point 14, and the output voltage VOUT of the connection point 14 increases as much, and the voltage value VOUT of the output voltage VOUT is calculated by the following expression.

$$VOUT=R3*R4/(R3+R4)[VCC/R3+[(1/R1-1/R2)-K2*(1/R1-K1/R2)]*Vi] \quad (10)$$

With the above arrangement, the output voltage VOUT of the connection point 14 is determined on the basis of the current Ia2, the current Ib2, and the current Ic2, and the output voltage of the temperature sensor circuit is corrected by the output voltage VOUT with a temperature. Therefore, the temperature correction having the continuous characteristic is conducted on the basis of a current change of the current Ia2, the current Ib2, and the current Ic2.

Because the plural temperature compensating circuits are not provided, and only one temperature compensating circuit is provided, the circuit scale becomes smaller.

When the temperature T changes from a high temperature equal to or higher than the set temperature To a low temperature lower than To, the temperature dependency of the output voltage VOUT shifts from Expression (7) to Expression (10). The temperature dependency becomes small as shown in FIG. 2.

Also, when the adjusted voltage Vi is adjusted through Expressions (7) and (10), the output voltage VOUT is adjusted, and the correction quantity, when the output voltage of the temperature sensor circuit is corrected with a temperature, is adjusted. When the mirror ratio 1:K1 of the transistor M11 and the transistor M12 is adjusted from Expression (6), the set temperature To is also adjusted. For example, when K1 is adjusted to K1>1, To<25° C. is satisfied, and when K1 is adjusted to K1<1, To>25° C. is satisfied. Further, when the mirror ratio 1:K2 of the transistor M13 and the transistor M14 is adjusted from Expression (10), the output voltage VOUT obtained when the temperature T is low is also adjusted.

Second Embodiment

Figure 3:
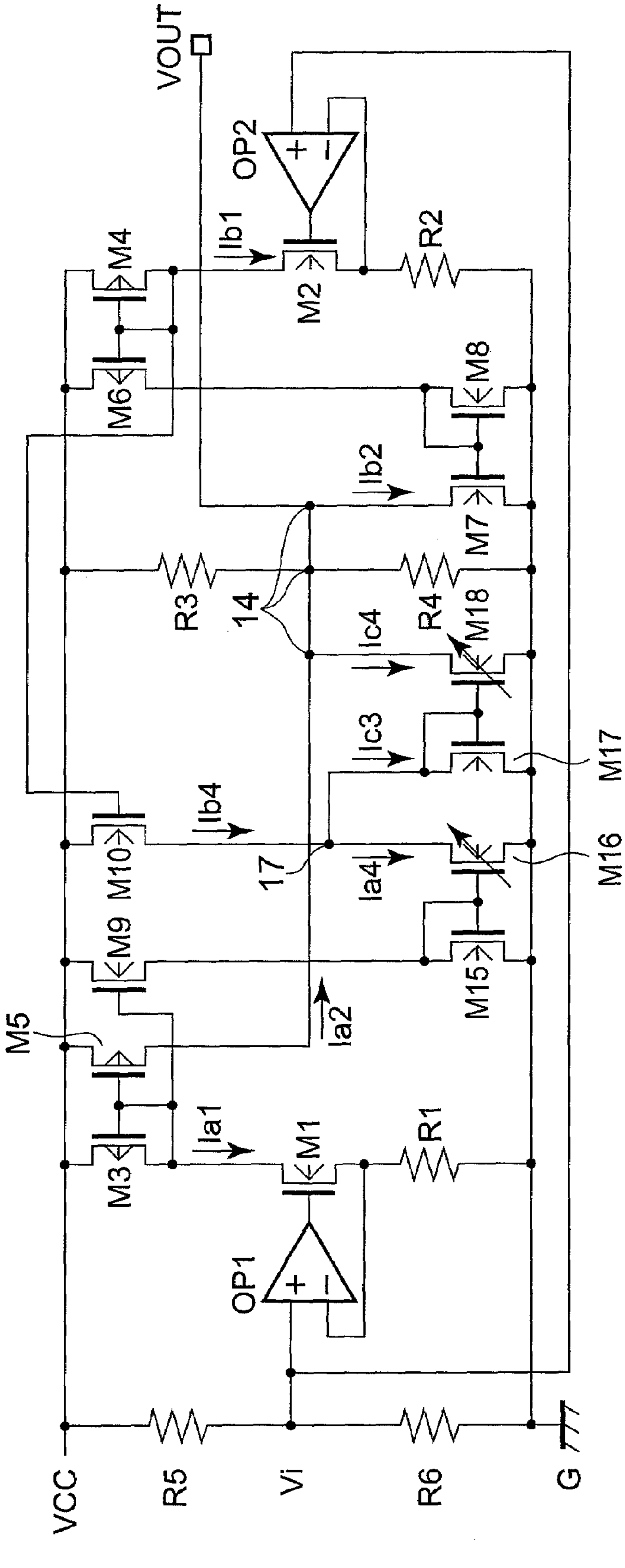
FIG. 3 is a diagram showing an outline of a temperature compensating circuit according to a second embodiment of the present invention.

Subsequently, a description will be given of a temperature compensating circuit according to a second embodiment of the present invention. FIG. 3 is a diagram showing the outline of a temperature compensating circuit according to the second embodiment of the present invention.

In the temperature compensating circuit according to the second embodiment of the present invention, the transistors M11 to M14 are deleted, and transistors M15 to M18 are added as compared with the temperature compensating circuit of the first embodiment of the present invention. In addition, the connection point 16 is deleted, and a connection point 17 is added.

The supply voltage VCC is divided into an adjusted voltage Vi, and input to the noninverting input terminals of the operational amplifiers OP1 and OP2, respectively. The operational amplifier OP1 and the transistor M1 allow a current Ia1 based on the adjusted voltage Vi to flow in the resistor R1 having a temperature coefficient TC1. The current Ia1 also flows in the transistor M3. Likewise, the operational amplifier OP2 and the transistor M2 also allow a current Ib1 based on the adjusted voltage Vi to flow in the resistor R2 having the temperature coefficient TC2, and the current Ib1 also flows in the transistor M4.

In this example, a current Ia2 based on the current Ia1 flows into the connection point 14. The current Ib2 based on the current Ib1 is extracted from the connection point 14.

Also, a current Ia4 based on the current Ia1 is extracted from the connection point 17. A current Ib4 based on the current Ib1 flows in the connection point 17.

In this case, a current Ic3 into which the current Ia4 is subtracted from the current Ib4 flows into the transistor M17. A current Ic4 based on the current Ic3 flows in the transistor M18, and the current Ic4 is extracted from the connection point 14.

The output voltage VOUT of the connection point 14 corrects the output voltage of a temperature sensor circuit not shown with a temperature.

Figure 4:
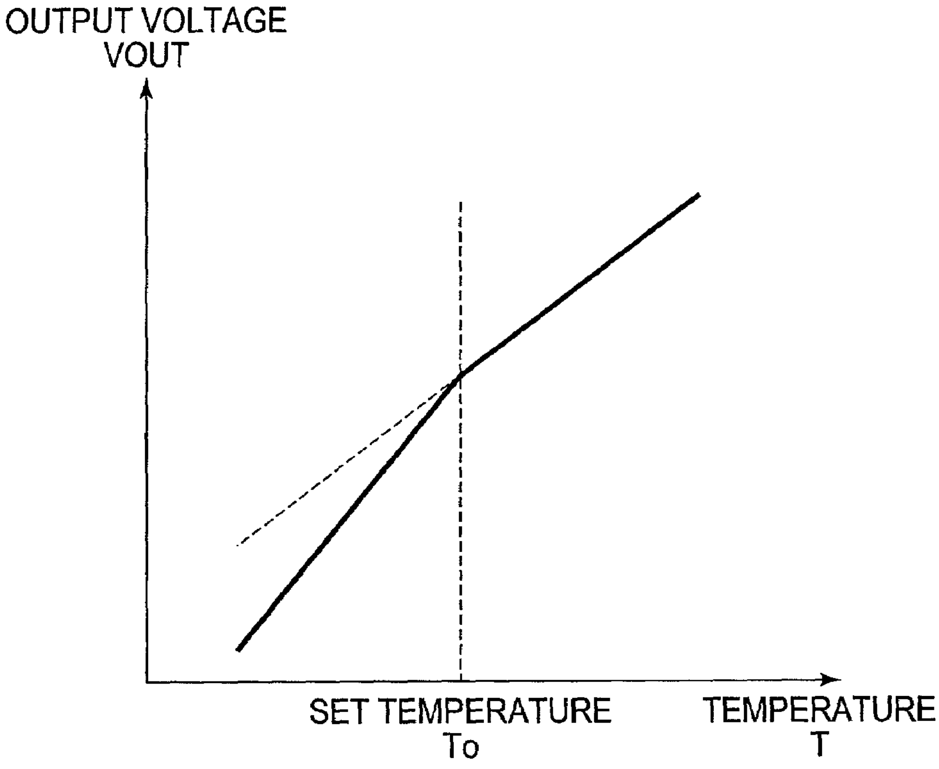
FIG. 4 is a diagram showing a temperature characteristic of an output voltage according to the second embodiment of the present invention.
Figure 5:
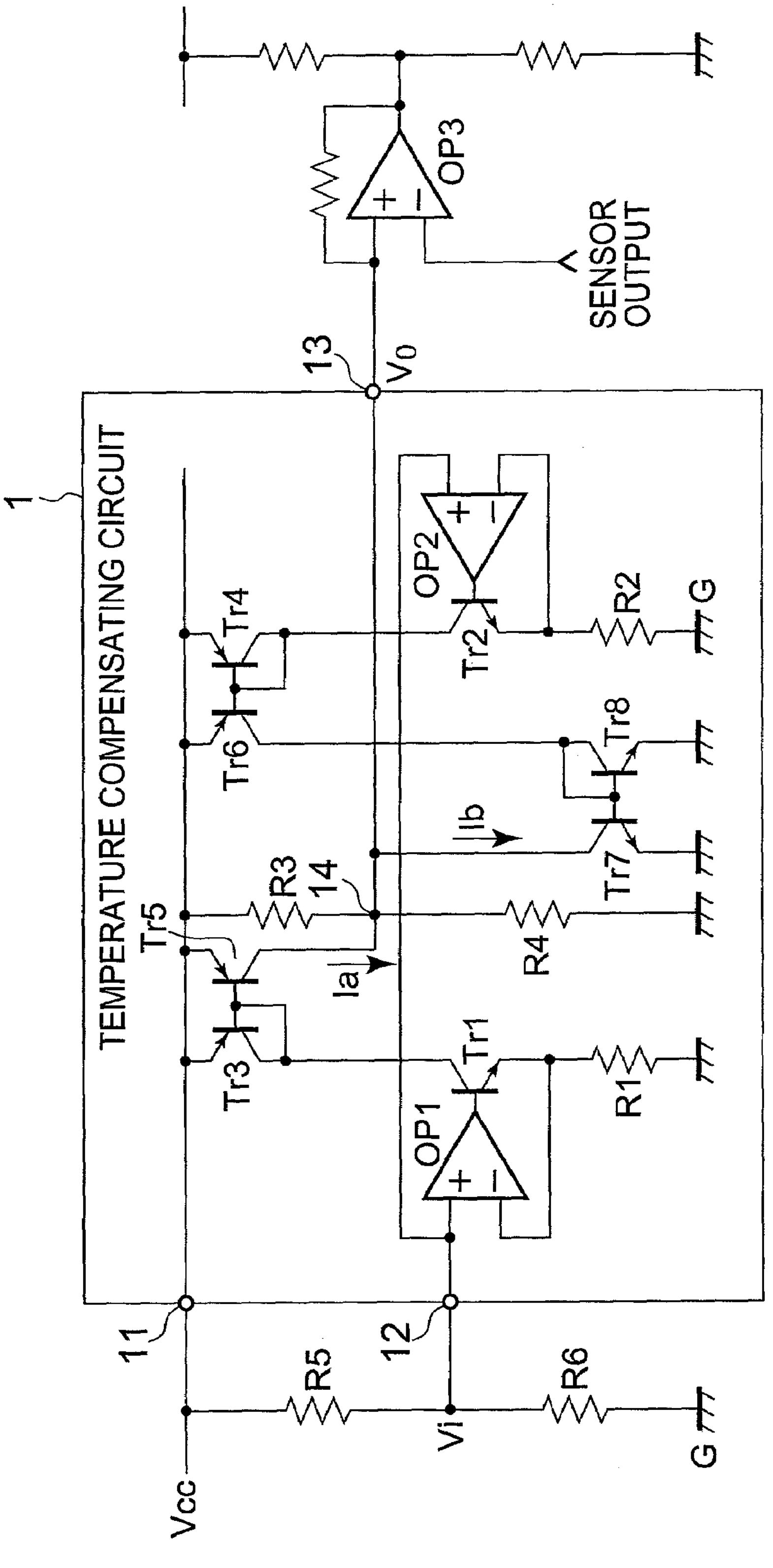
FIG. 5 PRIOR ART
FIG. 5 is a diagram showing an outline of a conventional temperature compensating circuit.
Figure 6:
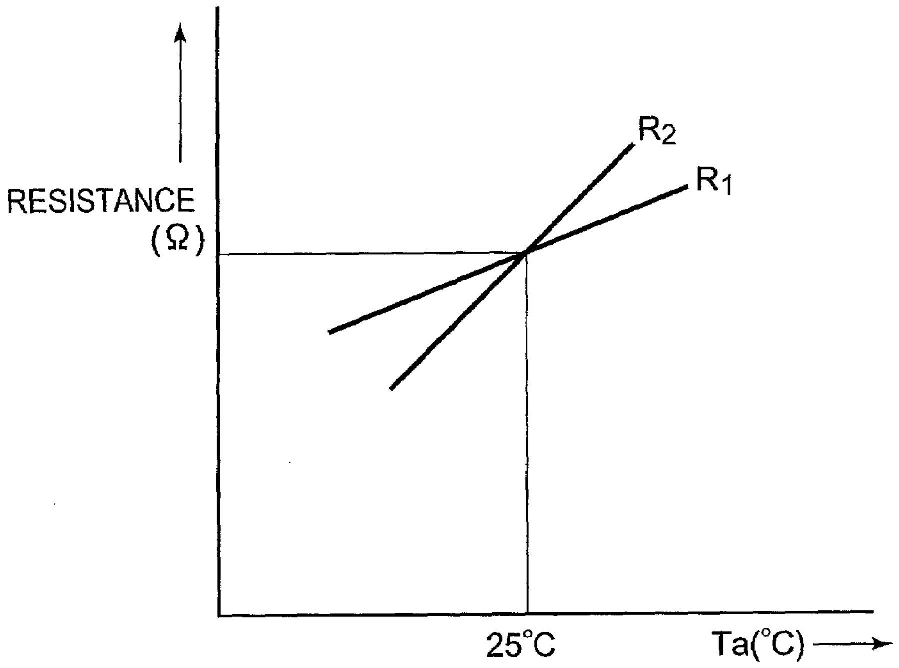
FIG. 6 is a diagram showing a temperature characteristics of resistors.
Figure 7:
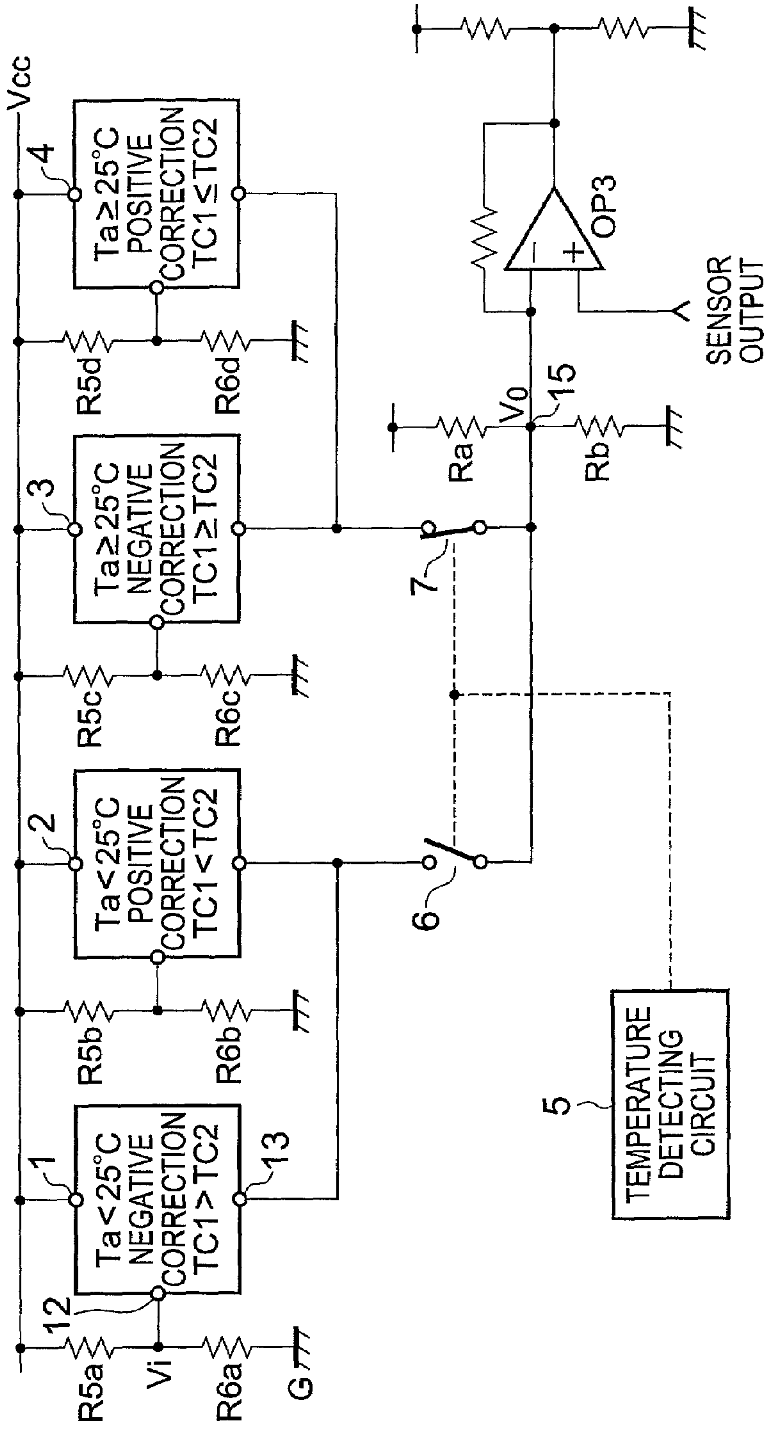
FIG. 7 is a diagram showing an outline when plural conventional temperature compensating circuits shown in FIG. 5 are prepared.
Figure 8:
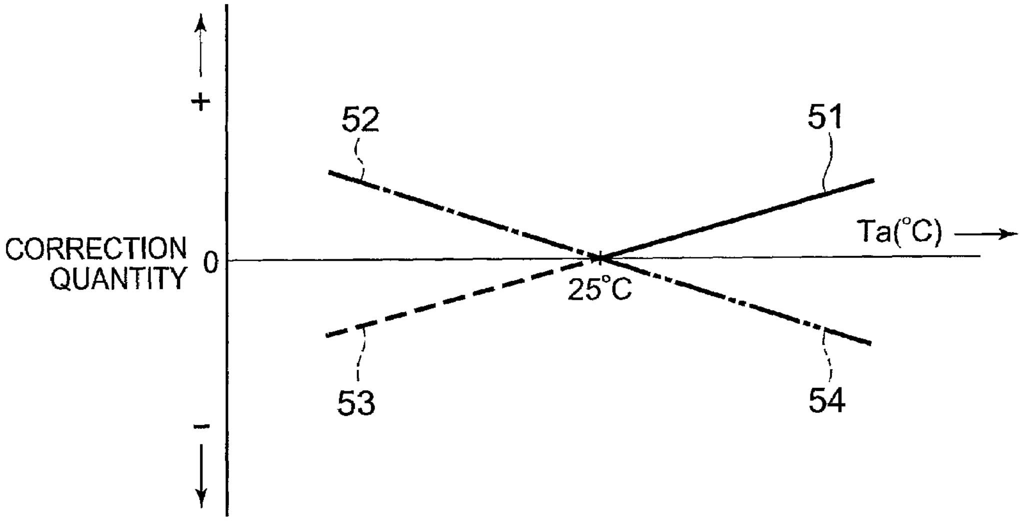
FIG. 8 is a diagram showing correction quantity due to the plural temperature compensating circuits shown in FIG. 7.
Figure 9:
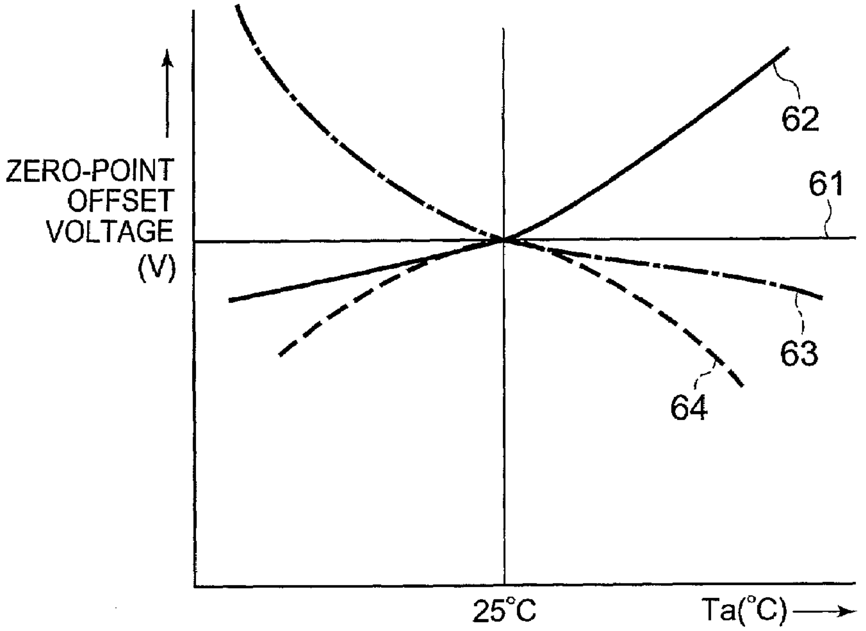
FIG. 9 is a diagram showing an example of a temperature characteristic of a zero-point offset voltage of a temperature sensor circuit.

Next, the output voltage VOUT will be described. FIG. 4 is a diagram showing a temperature characteristic of an output voltage according to the second embodiment of the present invention.

In this example, Expressions (1) to (4) in the first embodiment of the present invention are also met in the second embodiment of the present invention.

When it is assumed that the mirror ratio of the transistor M15 and the transistor M16 is 1:K3, the current value Ia4 of the current Ia4 is calculated by the following expression.

$$Ia4=K3*Ia1 \quad (11)$$

Through the above expressions (1) to (4) and (11), the temperature T when Ia4=Ib4 is set to the set temperature To, and the set temperature To is calculated by the following expression.

$$To=25+(1-K3)/(K3*TC1-TC2) \quad (12)$$

When the temperature T is equal to or higher than the set temperature To, the temperature coefficient TC2 of the resistor R2>the temperature coefficient TC1 of the resistor R1, and the resistance R2≧the resistance R1 are established. As a result, the current value Ib4≦the current value Ia4 is established. In this case, the voltage of the connection point 17 is substantially equal to the ground G, and the transistors M17 and M18 do not allow the current to flow. In this case, the voltage value VOUT of the output voltage VOUT is calculated by the following expression.

$$VOUT=R3*R4/(R3+R4)[VCC/R3+(1/R1-1/R2)*Vi] \quad (13)$$

When the temperature T is lower than the set temperature To, the current value Ib4>the current value Ia4 is established. In this case, the current value Ic3 of the current Ic3 in the transistor M17 is calculated by the following expression.

$$Ic3=Ib4-Ia4=Ib4-K3*Ia1 \quad (14)$$

value Ic3 of the current Ic3 in the transistor M17 is calculated by the following expression.

$$Ic3=Ib4-Ia4=Ib4-K3*Ia1 \quad (14)$$

Also, when it is assumed that the mirror ratio of the transistor M17 and the transistor M18 is 1:K4, the current value Ic4 of the current Ic4 in the transistor M18 is calculated by the following expression.

$$Ic4=K4*Ic3 \quad (15)$$

The current Ic4 is extracted from the connection point 14, and the output voltage VOUT of the connection point 14 decreases as much, and the voltage value VOUT of the output voltage VOUT is calculated by the following expression.

$$VOUT=R3*R4/(R3+R4)[VCC/R3+[(1/R1-1/R2)+K4*(K3/R1-1/R2)]*Vi] \quad (16)$$

With the above arrangement, when the temperature T changes from a higher temperature equal to or higher than the set temperature To a lower temperature lower than To, the temperature dependency of the output voltage VOUT shifts from Expression (13) to Expression (16), and as shown in FIG. 4, the temperature dependency becomes larger.

When the adjusted voltage Vi is adjusted through Expressions (13) and (16), the output voltage VOUT is also adjusted, and the correction quantity, when the output voltage of the temperature sensor circuit is corrected with a temperature, is also adjusted. Further, when the mirror ratio 1:K3 of the transistor M15 and the transistor M16 is adjusted from Expression (12), the set temperature To is also adjusted. When the mirror ratio 1:K4 of the transistor M17 and the transistor M18 is adjusted from Expression (16), the output voltage VOUT, when the temperature T is low, is also adjusted.

What is claimed is:

1. A temperature compensating circuit for correcting an output voltage of a temperature sensor circuit with respect to an actual temperature, the temperature compensating circuit comprising:

a first current output means for outputting a first current based on a supply voltage and a first resistor having a first temperature characteristic;

a second current output means for outputting a second current based on the supply voltage and a second resistor having a second temperature characteristic;

a connection point that is supplied with a current based on the first current and a current based on the second current which are different in polarity from each other; and a current mirror circuit for supplying a determined current to the connection point, depending on a difference between the current based on the first current and the current based on the second current;

wherein an output voltage of the temperature compensating circuit is determined at the connection point and the output voltage differs as the determined current changes depending on whether the actual temperature is higher or lower than a set temperature; and wherein correction of the temperature when the temperature is higher than the set temperature and the correction of the temperature when the temperature is lower than the set temperature, are conducted within a single temperature compensating circuit, thereby maintaining continuity of the correction of the temperature at different set temperatures.

2. A temperature compensating circuit according to claim 1, wherein:

the current mirror circuit supplies to the connection point a resulting current which subtracts the current based on the first current from the current based on the second current when the current based on the first current is smaller than the current based on the second current and when the actual temperature is lower than the set temperature; and the current mirror circuit supplies no current to the connection point when the current based on the first current is equal to or higher than the current based on the second current and when the actual temperature is higher than the set temperature.

* * * * *